United States Patent [19]
Ninomiya

[11] Patent Number: 5,327,384
[45] Date of Patent: Jul. 5, 1994

[54] FLASH MEMORY

[75] Inventor: Kazuhisa Ninomiya, Tokyo, Japan

[73] Assignee: Nec Corporation, Japan

[21] Appl. No.: 997,230

[22] Filed: Dec. 28, 1992

[30] Foreign Application Priority Data

Dec. 27, 1991 [JP] Japan .................................. 3-359814

[51] Int. Cl.⁵ ............................................. G11C 7/00
[52] U.S. Cl. .................................. 365/218; 365/900; 365/185
[58] Field of Search ........... 365/218, 900, 185, 230.03, 365/238, 238.05, 104

[56] References Cited

U.S. PATENT DOCUMENTS

| | | | |
|---|---|---|---|
| 4,931,997 | 6/1990 | Mitsuishi et al. | 365/218 |
| 5,095,461 | 3/1992 | Miyakawa et al. | 365/185 |
| 5,214,605 | 5/1993 | Lim et al. | 365/218 |

FOREIGN PATENT DOCUMENTS 2235999  3/1991  United Kingdom .............. 365/218

Primary Examiner—Eugene R. LaRoche
Assistant Examiner—Son Mai
Attorney, Agent, or Firm—Laff, Whitesel, Conte & Saret

[57] ABSTRACT

A flash memory of the present invention has a comparator for inspecting whether or not data is erased from each memory cell. If data written in each of all the memory cells has been erased completely, erasing operation to the memory cell block is prohibitted.

6 Claims, 5 Drawing Sheets

44 SOURCE CIRCUIT

48 SOURCE CONTROL CIRCUIT

72(76) FLIP-FLOP

82 SOURCE CONTROL CIRCUIT

FLASH MEMORY

FIELD OF THE INVENTION

This invention relates to a flash memory, and more particularly, to a flash memory having a plurality of memory cell blocks separately controlled in programmable and erasing operation.

BACKGROUND OF THE INVENTION

A typical non-volatile semiconductor memory device, in which contents are electrically programmable and simultaneously erased by one operation (hereinafter it is called "flash memory"), includes a plurality of memory cells each provided with a floating gate covered with an insulation layer.

In such a flash memory, charges are injected to a floating gate by an avalanche breakdown or channeling so that a threshold voltage of the memory cell is raised to write a predetermined data therein. On the other hand, charges are removed from a floating gate of a memory cell by a tunnel effect between the floating gate and a source or a substrate of the memory cell in order to erase a data stored in the memory cell.

In such a flash memory, a threshold value of a memory cell may become negative by an over-erasing, so that the memory cell is constantly conductive. Consequently, all of memory cells connected to a bit line common to the conductive memory cell become constantly conductive.

Accordingly, some kinds of flash memories with a function for inspecting erasing condition have been proposed. In a first conventional flash memory, each floating gate of memory cell is injected with charges of predetermined amount before erasing operation to uniform charged condition of the memory cells. Then, an erasing voltage is applied to each memory cell for a time shorter than a time which is required to erase data in the memory cell. After that, an erase check voltage, for example 3.2 V voltage generated by dropping an external voltage, is applied to a gate of each memory cell to inspect whether or not data has been erased from the memory cell. The operation of erasing and inspection is repeated until data are erased from all the memory cells completely.

According to the first conventional flash memory, however, there is a disadvantage in that some of memory cells may be over-erased due to non uniformity of erasing speed among the memory cells when data written in all the memory cells are simultaneously erased. As a result, the flash memory can not operate normally.

A second conventional flash memory includes a memory region divided into plural blocks each composed of plural memory cells. According to the second conventional flash memory, non uniformity of erasing speed among the memory cells is decreased. However, it is required that erasing operation is repeated by times corresponding to the number of the memory cell blocks in order to erase data stored in all memory cells of the flash memory. As a result, the erasing time becomes long totally.

SUMMARY OF THE INVENTION

Accordingly, it is an object of the invention to provide a flash memory in which data stored in memory cells can be erased effectively without over-erasing.

According to the invention, a flash memory includes:

means for erasing data written in each memory cell of the memory cell block which is selected to be erased;

means for inspecting whether or not data is erased from each memory cell of each memory cell block, and generating a control signal when data written in each of all the memory cells of the memory cell block is erased completely; and means for controlling the data erasing means in accordance with the control signal to prohibit the erasing operation to the memory cell block in which all the data have been erased.

The other objects and features of the invention will become understood from the following description with reference to the accompanying drawings.

DESCRIPTION OF THE PREFERRED EMBODIMENTS

For better understanding the background of the present invention, the basic principle of the conventional technology is first described hereinafter with reference to FIG. 1.

Figure 1:
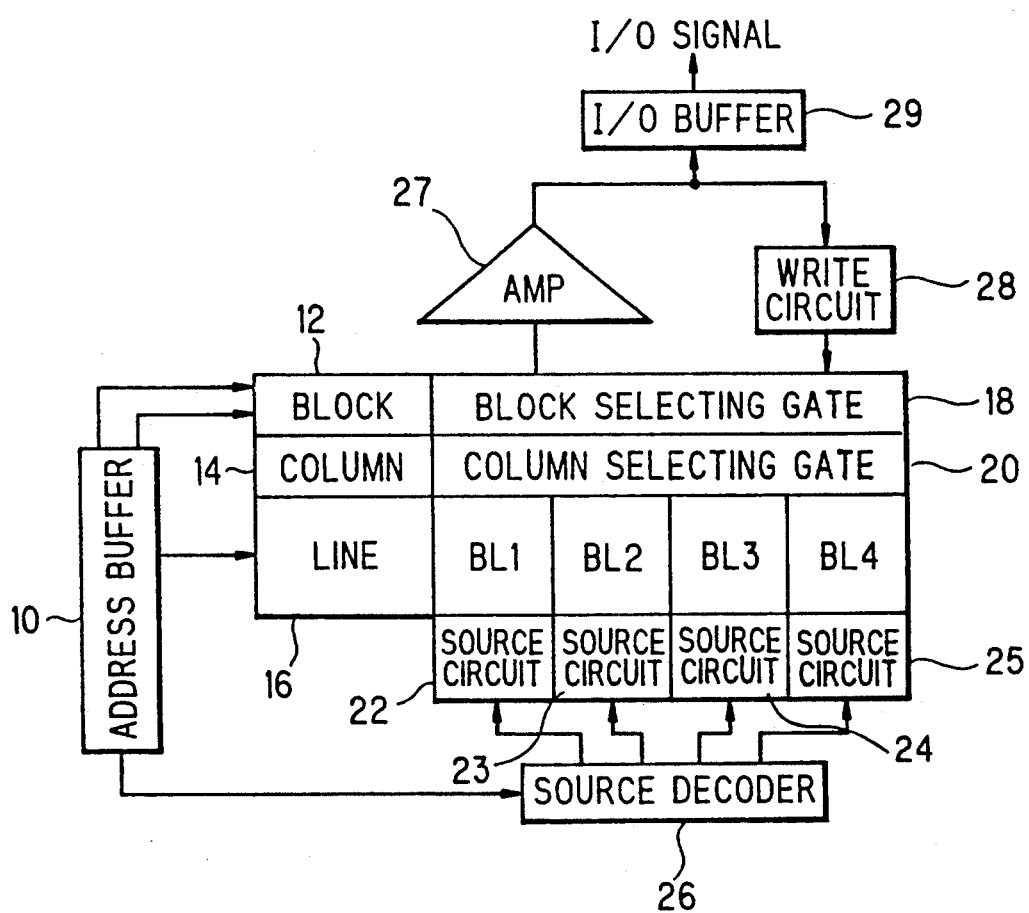
FIG. 1 is a block diagram showing a conventional flash memory.

FIG. 1 shows a conventional flash memory (referred formerly to as "the second conventional flash memory"), which includes four memory cell blocks BL1 to BL4 each composed of a plurality of memory cells (not shown), an address buffer 10, a block decoder 12, a column decoder 14 and a line decoder 16 both connected to the address buffer 10, a block selecting gate 18 connected to the block decoder 12, a column selecting gate 20 connected to the column decoder 14, four source circuits 22 to 25 connected to the memory cell blocks B1 to B4, respectively, a source decoder 26 connected between the address buffer 10 and the source circuits 22 to 25, a sense amplifier 27 connected through the block and column selecting gates 18 and 20 to the memory cell blocks BL1 to BL4, a write circuit 28 connected through the block and column selecting gates 18 and 20 to the memory cell blocks BL1 to BL4, and an input and output buffer (I/O buffer) 29 connected to the sense amplifier 27 and the write circuit 28.

Next, erasing operation of the conventional flash memory will be explained. When an external address signal specifying one of the memory cell blocks BL1 to BL4 to be erased is suplied to the adress buffer 10, an erasing block selecting signal is supplied from the address buffer 10 to the source decoder 26.

In response to the selecting signal, the source decoder 26 supplies an erase signal to the source circuit connected to the selected memory cell block, and the source circuit applies an erase voltage to each memory cell in the selected memory cell block. Thus, all the memory cells in the selected memory cell block is erased by one operation.

Figure 2:
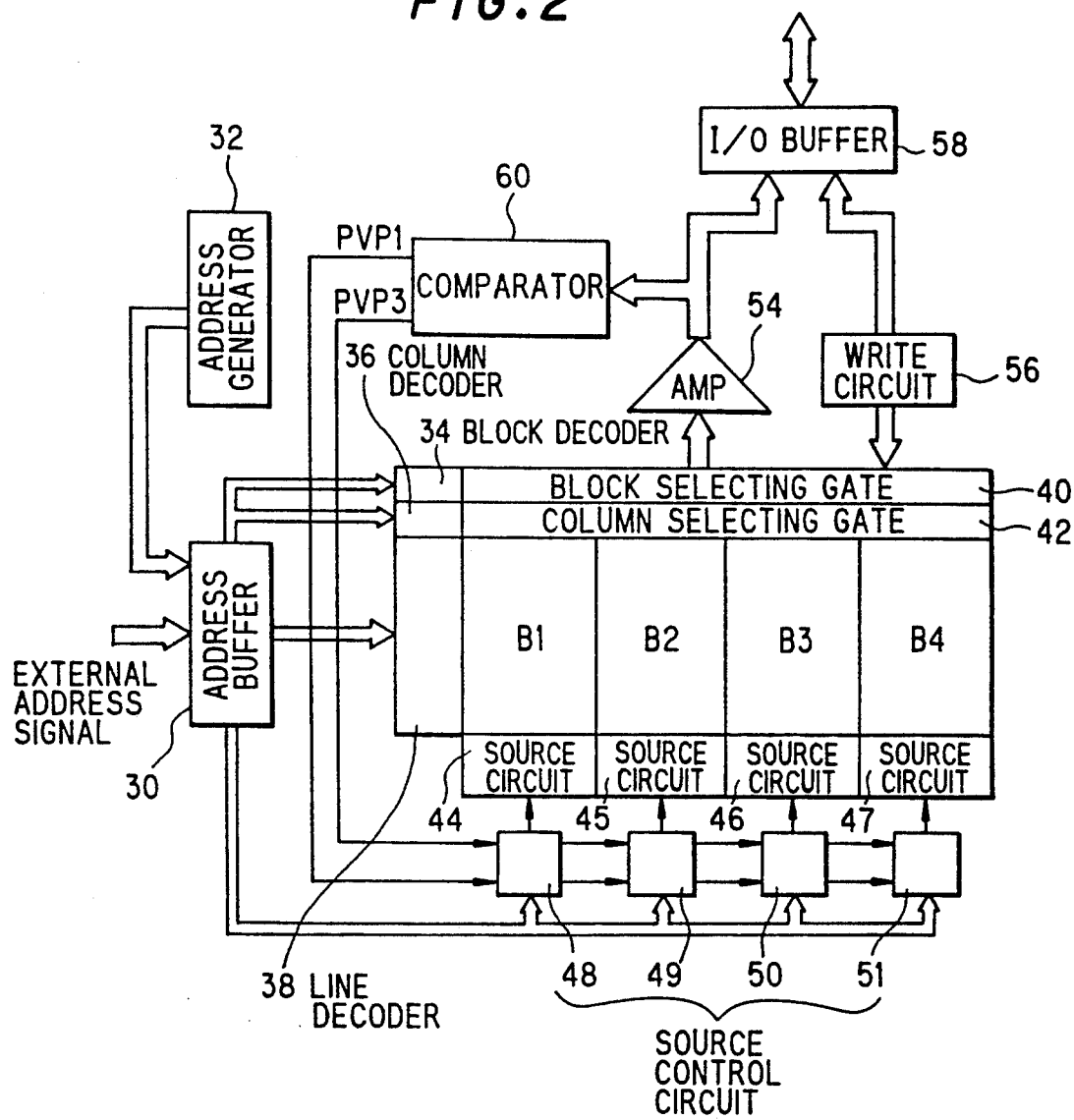
FIG. 2 is a block diagram showing a flash memory of a first preferred embodiment according to the invention.

FIG. 2 shows a flash memory of a first preferred embodiment according to the invention, which includes four memory cell blocks B1 to B4 each composed of a plurality of memory cells (not shown), an address buffer 30 to which an external address signal is supplied, an address generating circuit 32 connected to the address buffer 30, a block decoder 34, a column decoder 36 and a line decoder 38 both connected to the address buffer 30, a block selecting gate 40 connected to the block decoder 34, a column selecting gate 42 connected to the column decoder, four source circuits 44 to 47 connected to the memory cell blocks B1 to B4, respectively, four source control circuits 48 to 51 connected to the source circuits 44 to 47 for control them, respectively, a sense amplifier 54 connected through the block and column selecting gates 40 and 42 to the memory cell blocks B1 to B4, a write circuit 56 connected through the block and column selecting gates 40 and 42 to the memory cell blocks B1 to B4, an input and output buffer (I/O buffer) 58 connected to the sense amplifier 54 and the write circuit 56, and a comparator 60 connected at an input to the sense amplifier 54 and at an output to the source control circuits 48 to 51.

The comparator 60 inspects whether or not a predetermined data is written in each memory cell. And, then if the predetermined data is written in each of all the memory cells, that is, if all the memory cells are in non-conductive state, a write completion signal is supplied from the comparator 60 to one of the source control circuits 48 to 51 connected to the memory cell block which has the written memory cells.

The comparator 60 further inspects whether or not the data in the memory cells have been erased completely, in other words, all the memory cells are in conductive state. And, then if each of all the memory cells has been erased, an erase completion signal is supplied from the comparator 60 to one of the source control circuits 48 to 51 connected to the erased memory cell block which has the erased memory cells.

Next, operation of the flash memory will be explained. In data reading mode, when an external address signal is supplied to the address buffer 30, an internal address signal is supplied to the block, column and line decoders 34, 36 and 38, respectively.

In response to the internal address signal, a predetermined word line corresponding to the internal address is selected by the line decoder 38. In response to the internal address signal, a block selecting signal and a column selecting signal each corresponding to the internal address are supplied from the block decoder 34 and the column decoder 36 to the block and column selecting gates 40 and 42, respectively. And, then a bit line is selected in accordance with the block and column selecting signals, so that a memory cell is selected as a cross point between the word line and the bit line.

After that, a data which has been stored in the selected memory cell is supplied to the I/O buffer 58 after being amplified at the sense amplifier 54, and is transmitted to the following stage.

In data writing mode, one memory cell is selected in the same manner as in the reading mode, and a data supplied to the I/O buffer 58 is written through the write circuit 56 into the selected memory cell.

Next, operation in data erasing mode will be explained. In this explanation, the case where data written in each memory cell of the memory cell blocks B1 and B3 are simultaneously erased by one operation will be explained on behalf of the other cases.

When an external address signal specifying the memory cell blocks B1 and B3 is supplied to the adress buffer 30, an erasing block selecting signals corresponding to the address signal are supplied from the address buffer 30 to the source control circuits 48 and 50, and the signals are latched therein, respectively. Then, data of "00H", which is a pre-program signal, is supplied through the I/O buffer 58 and the write circuit 56 to each memory cell of the memory cell blocks B1 and B3, and the signal is written therein.

After the pre-program operation, an inspection whether or not the data "00H" has been written in each memory cell is carried out by the comparator 60.

In this inspection, if it is found that the data "00H" has been written in each of all the memory cells of the memory cell blocks B1 and B3, write completion signals PVP1 and PVP3 are supplied from the comparator 60 to the source control circuits 48 and 50, respectively. In response to the write completion signals PVP1 and PVP3, erase enabling signals EEN1 and EEN3 are supplied from the source control circuits 48 and 50 to the source circuits 44 and 46, respectively.

On the other hand, if the data "00H" has not been written in all the memory cells of the memory cell block yet, the write completion signals PVP1 and PVP3 are not supplied from the comparator 60, so that the erase enabling signals EEN1 and EEN3 are not supplied from the source control circuits 48 and 50.

In response to the erase enabling signals EEN1 and EEN3, the source circuits 44 and 46 apply an erase voltage VER to each of all the memory cells in the memory cell blocks B1 and B3. This operation will be explained in more detail later.

On the other hand, the source circuits 45 and 47 apply a predetermined reference voltage to each of the all the memory cells in the memory cell blocks B2 and B4 to prohibit erasing operation to the memory cell blocks B2 and B4.

During the erasing operation, an inspection whether or not data which had been written in each of the memory cells has been erased completely is carried out by the comparator 60.

In this inspection, if it is found that data in each of all the memory cells of the memory cell blocks B1 and B3 have been erased completely, erase completion signals EVP1 and EVP3 are supplied from the comparator 60 to the source control circuits 48 and 50, respectively.

In response to the erase completion signals EVP1 and EVP3, the erase enabling signals EEN1 and EEN3 are reset, and erase prohibit signals are supplied from the source control circuits 48 and 50 to the source circuits 44 and 46, so that erasing operation to the memory cell blocks B1 and B3 is prohibitted.

On the other hand, if all data in the memory cells of the memory cell blocks B1 and B3 have not been erased yet, erase completion signal is not supplied to the memory cell blocks, so that the erasing operation is repeated.

Figure 3:
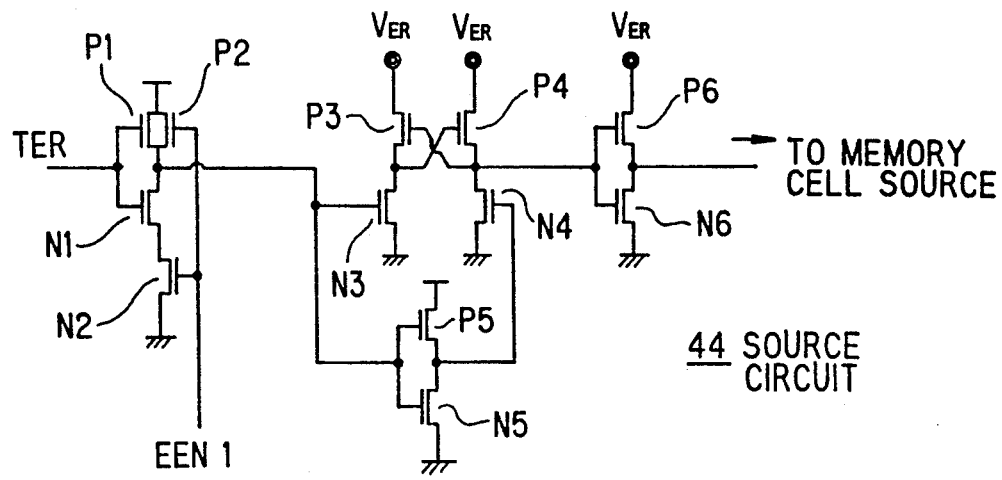
FIG. 3 is a circuit diagram showing a source circuit used in the first preferred embodiment shown in FIG. 2.

FIG. 3 shows the source circuit 44, which includes six P-transistors P1 to P6 and six N-transistors N1 to N6 connected as shown in the figure. Each of the other source circuits 45 to 47 has the samd structure as the source circuit 44, so that the other circuits 45 to 47 are not shown here.

In the source circuit 44, when the erase enabling signal EEN1 of high level and a control signal TER of high level are supplied from the source control circuit 48 to each gate of the transistors P2 and N2 and to each gate of the transistors P1 and N1, respectively, the erase voltage VER is applied to each of memory cell sources in the memory cell block B1. Therefore, data stored in each of the memory cells is erased.

On the other hand, when the erase enabling signal EEN1 of low level is not supplied from the source control circuit 48, the reference voltage is applied to each of memory cell sources in the memory cell block B1 even though the control signal TER of high level is supplied to the source circuit 44. Therefore, data stored in each of the memory cells is not erased.

Figure 4:
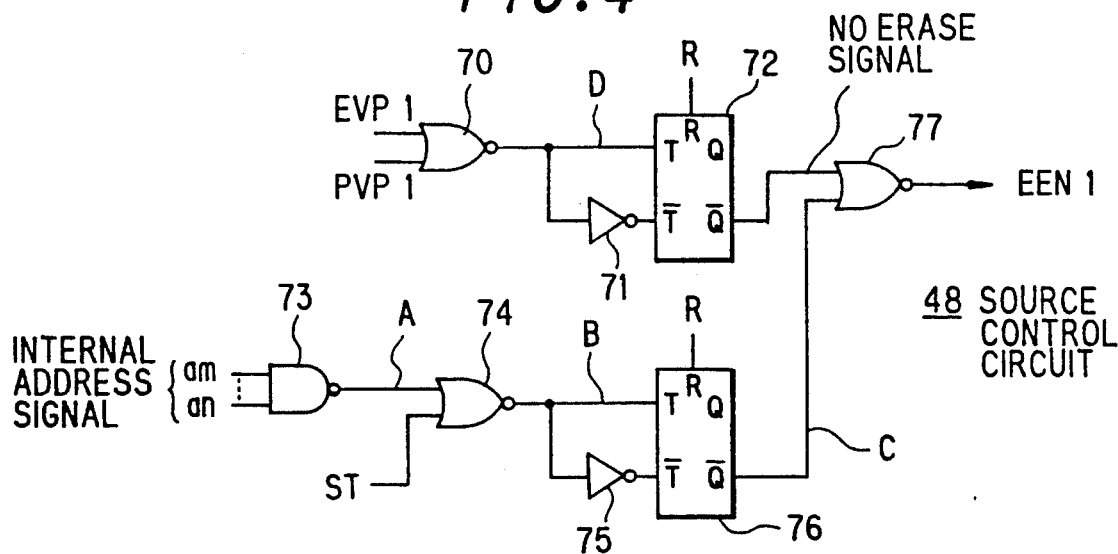
FIG. 4 is a circuit diagram showing a source control circuit used in the first preferred embodiment shown in FIG. 2.

FIG. 4 shows the source control circuit 48, which includes a NOR gate 70 connected to the comparator 60, an invertor 71 connected at an input to an output of the NOR gate 70, a flip-flop circuit 72 connected at inputs to the NOR gate 70 and the invertor 71, a NAND gate 73 connected to the address buffer 30, a NOR gate 74 connected at one of inputs to an output of the NAND gate 73, an invertor 75 connected at an input to an output of the NOR gate 74, a flip-flop circuit 76 connected at inputs to the outputs of the NOR gate 70 and the invertor 71, and a NOR gate 77 connected at inputs to reverse outputs of the flip-flop circuits 72 and 76, respectively.

The NOR gate 70 is supplied with the erase completion signal EVP1 and the write completion signal PVP1 from the comparator 60. The NAND gate 73 is supplied with internal address signals "am" to "an" from the address buffer 30.

Each of the other source control circuits 49 to 51 has the same structure as this circuit 48, so that the other circuits 45 to 47 are not shown here.

Figure 5:
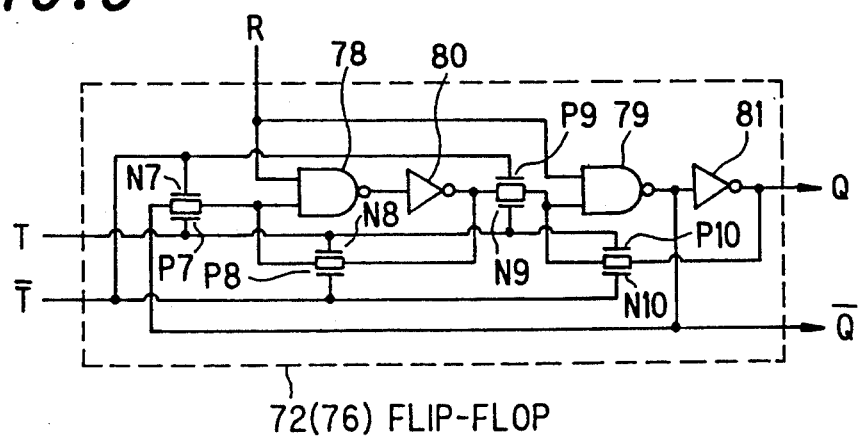
FIG. 5 is a circuit diagram showing a flip-flop used in the source control circuit shown in FIG. 4.

FIG. 5 shows the flip-flop circuit 72 (76), which includes four N-transistors N7 to N10, four P-transistors P7 to P10, a NAND gate 78, a NAND gate 79 and two inverters 80 and 81. These components are connected as shown in FIG. 5. In the flip-flop circuit, an output level is reversed at a time when an input signal rises up, and the output level is reset to be low when a reset signal of low level is supplied thereto.

Figure 6:
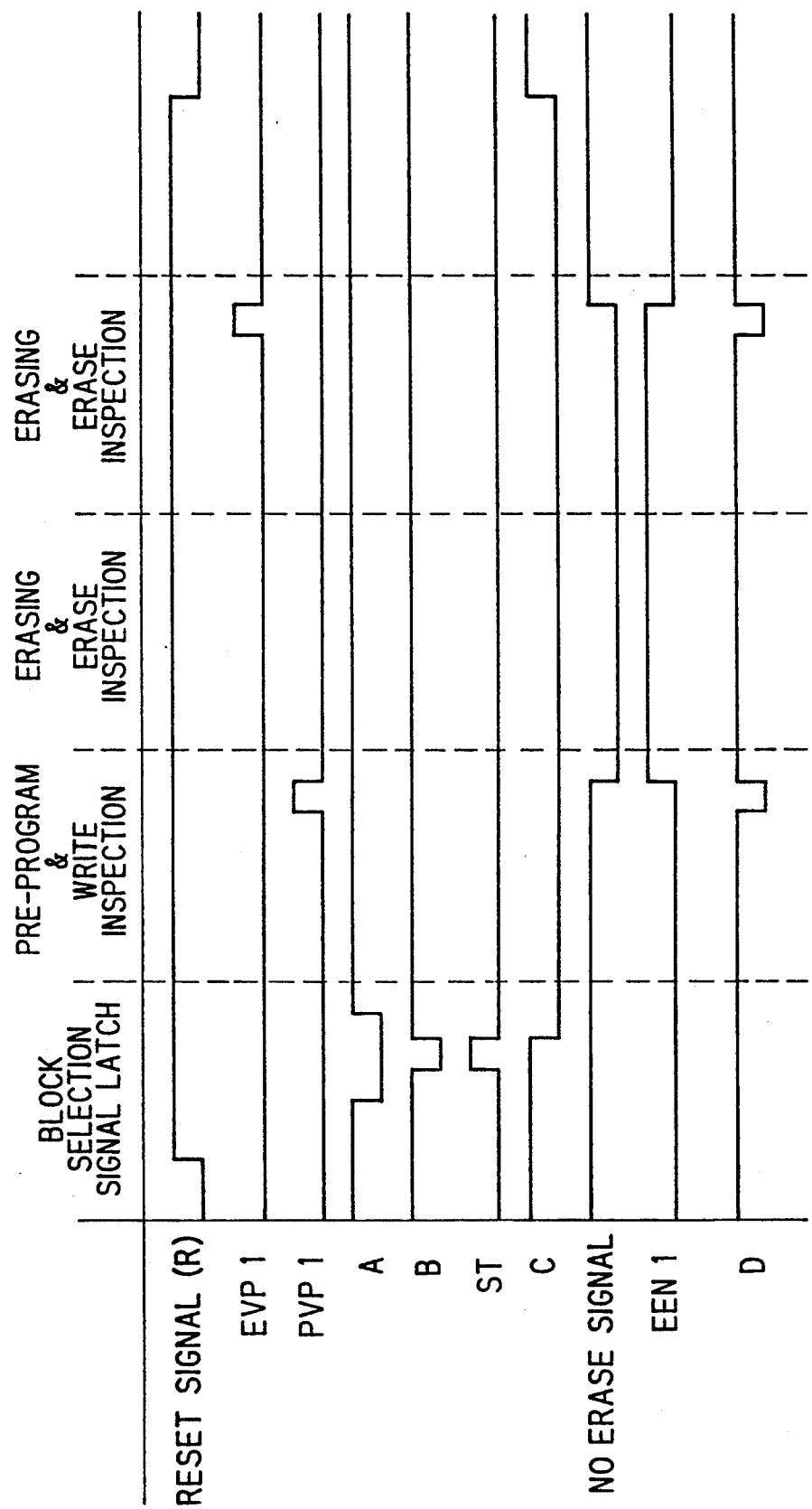
FIG. 6 is a timing chart showing operation of the first preferred embodiment.

Next, operation of the source control circuit 48 will be explained in conjunction with FIG. 6. When all the internal address signals "am" to "an" become high, a level at a point A changes to low. In this condition, when a block latch signal ST is supplied to the NOR gate 74, a level at a point B becomes low, so that the flip-flop circuit 76 supplies a low level signal to the NOR gate 77.

In this condition, when the write completion signal PVP1 is supplied to the NOR gate 70, a high level signal is supplied from the NOR gate 70, so that the flip-flop circuit 72 supplies a "no erase signal" of low level to the NOR gate 77. Then, the erase enabling signal EEN1 of high level is supplied therefrom to the source circuit 44.

After that, when the erase completion signal EVP1 of high level is supplied to the NOR gate 70, the flip-flop circuit 72 supplies a "no erase signal" of high level to the NOR gate 77, so that the erase enabling signal EEN1 of low level is supplied from the NOR gate 77 to the source circuit 44. As a result, the erasing operation to the memory cell block B1 is prohibited. As described above, in the source control circuit 48 of the first preferred embodiment, a level of the "no erase signal" is controlled by operation of the flip-flop circuit 72.

Figure 7:
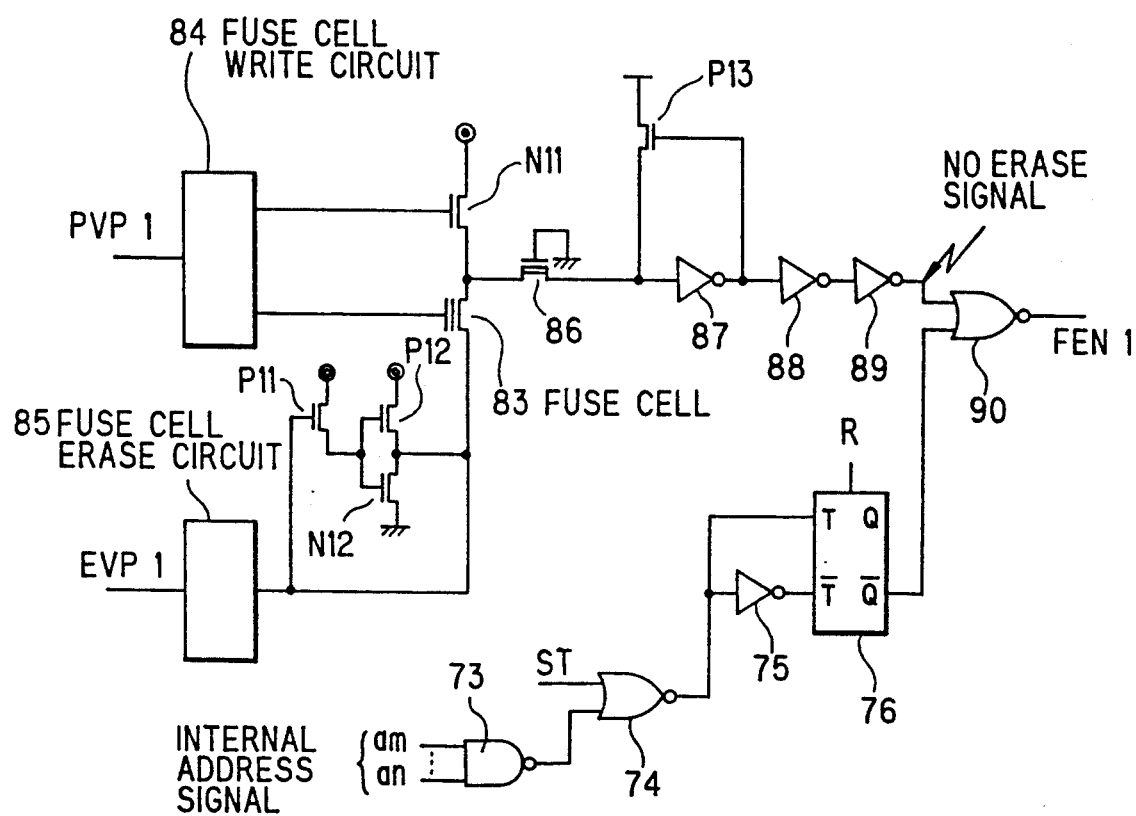
FIG. 7 is a circuit diagram showing a source control circuit used for a second preferred embodiment according to the invention.

FIG. 7 shows a source control circuit 82 used in a flash memory of a second preferred embodiment according to the invention. The source control circuit 82 includes a fuse cell 83, a fuse cell write circuit 84, a fuse cell erase circuit 85, an N-transistor 86 of depletion type, two N-transistors N11 and N12, three P-transistors P11, P12 and P13, an NAND gate 73, two NOR gates 74 and 90, four inverters 75 and 87 to 89, and flip-flop circuit 76. These components are connected each other as shown in the figure.

In the source control circuit 82, when a write completion signal PVP1 is supplied to the fuse cell write circuit 84, program signals are supplied to the N-transistor N11 and the fuse cell 83, so that a predetermined data is written in the fuse cell 83 and the fuse cell 83 becomes to be non-conductive state. Therefore, the "no erase signal" of low level is supplied to the NOR gate 90, so that an erase enabling signal EEN1 of high level is supplied from the NOR gate 90 to the source circuit 44. As a result, erasing operation is carried out to the memory cell block B1.

After that, when an erase completion signal EVP1 is supplied to the fuse cell erase circuit 85, an erase voltage is applied from the circuit 85 to a source of the fuse cell 83, so that the data stored in the fuse cell 83 is erased and the fuse cell 83 becomes to be conductive state. Therefore, the "no erase signal" of high level is supplied to the NOR gate 90, so that the erase enabling signal EEN1 is not supplied therefrom. As a result, erasing operation to the memory cell block B1 is prohibited.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching herein set forth.

What is claimed is:

1. A flash memory, having a memory region divided into a plurality of memory blocks each having a plurality of memory cells, comprising:
    means for erasing data written in each memory cell of any one of said memory cell blocks which is selected to be erased;
    means for inspecting whether or not data is erased from each memory cell of each memory cell block, and for generating a control signal when data written of all of the memory cells of the memory cell block are erased completely; and
    means for controlling said data erasing means in accordance with said control signal to prohibit the erasing operation to said memory cell block in which all the data have been erased, said means for controlling said data erasing means comprising a flip-flop circuit for latching said control signal.

2. A flash memory, having a memory region divided into a plurality of memory blocks each having a plurality of memory cells, comprising:
    means for erasing data written in each memory cell of any one of said memory cell blocks which is selected to be erased;
    means for inspecting whether or not data is erased from each memory cell of each memory cell block, and for generating a control signal when data written in all of the memory cells of the memory cell block are erased completely, and means for controlling said data erasing means in accordance with said control signal to prohibit the erasing operation to said memory cell block in which all the data have been erased said means for controlling said data erasing means comprising an electrically erasable non-volatile semiconductor memory device for latching said control signal.

3. A flash memory, having a memory region divided into a plurality of memory blocks each having a plurality of memory cells comprising;

means for erasing data written in each memory cell of any one of said memory cell blocks which is selected to be erased;

means for inspecting whether or not data is erased from each memory cell of each memory cell block, and for generating a control signal when data written in all of the memory cells of the memory cell block are erased completely;

means for controlling said data erasing means in accordance with said control signal to prohibit the erasing operation of said memory cell block in which all the data have been erased;

means for writing a pre-program data into each of said memory cells of said selected memory cell block before an erasing operation of the memory cell block is carried out; and means for inspecting whether or not said pre-program data is written into all of the memory cells in each of said selected memory cell blocks, and for generating a write completion signal to said controlling means;

wherein said controlling means controls said data erasing means in accordance with said write completion signal to start the erasing operation to said memory cell block in which said pre-program data is written in each of all memory cells.

4. A flash memory, according to claim 3, wherein;

said means for controlling said data erasing means comprises a flip-flop circuit for latching said control signal.

5. A flash memory, having a memory region divided into a plurality of memory blocks each having a plurality of memory cells comprising;

means for erasing data written in each memory cell of any one of said memory cell blocks which is selected to be erased;

means for inspecting whether or not data is erased from each memory cell of each memory cell block, and for generating a control signal when data written in all of the memory cells of the memory cell block are erased completely;

means for controlling said data erasing means in accordance with said control signal to prohibit the erasing operation of said memory cell block in which all the data have been erased, and said means for controlling said data erasing means comprising an electrically erasable non-volatile semiconductor memory device for latching said control signal.

6. A flash memory, having a memory region divided into a plurality of memory blocks each having a plurality of memory cells comprising;

means for erasing data written in each memory cell of said memory cell blocks which is selected to be erased;

means for inspecting whether or not data is erased from each memory cell of each memory cell block, and for generating a control signal when data written in all of the memory cells of the memory cell block are erased completely, said control signal generating means comprising an electrically erasable non-volatile semiconductor memory device for latching said control signal;

means for controlling said data erasing means in accordance with said control signal to prohibit the erasing operation of said memory cell block in which all the data have been erased;

means for writing a pre-program data into each of said memory cells of said selected memory cell block before an erasing operation of the memory cell block is carried out;

means for inspecting whether or not said pre-program data is written into all of the memory cells in each of said selected memory cell blocks, and for generating a write completion signal to said controlling means; and wherein said controlling means controls said data erasing means in accordance with said write completion signal to start the erasing operation of said memory cell block in which said pre-program data is written in each of all memory cells.

* * * * *